United States Patent
Togo

(10) Patent No.: US 9,419,103 B2
(45) Date of Patent: Aug. 16, 2016

(54) STRESS MODULATION IN FIELD EFFECT TRANSISTORS IN REDUCING CONTACT RESISTANCE AND INCREASING CHARGE CARRIER MOBILITY

(71) Applicant: GLOBALFOUNDRIES Inc., Grand Cayman (KY)

(72) Inventor: Mitsuhiro Togo, Burnt Hills, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/593,264

(22) Filed: Jan. 9, 2015

(65) Prior Publication Data

US 2016/0204226 A1 Jul. 14, 2016

(51) Int. Cl.
| | |
|---|---|
| *H01L 29/66* | (2006.01) |
| *H01L 21/265* | (2006.01) |
| *H01L 29/78* | (2006.01) |
| *H01L 21/3215* | (2006.01) |
| *H01L 21/324* | (2006.01) |

(52) U.S. Cl.
CPC .... *H01L 29/66568* (2013.01); *H01L 21/26513* (2013.01); *H01L 21/324* (2013.01); *H01L 21/3215* (2013.01); *H01L 29/7847* (2013.01); *H01L 29/7848* (2013.01)

(58) Field of Classification Search
CPC .................. H01L 21/26506; H01L 29/66568; H01L 21/26513; H01L 29/7848; H01L 21/3215; H01L 21/324; H01L 29/7847
See application file for complete search history.

(56) References Cited

U.S. PATENT DOCUMENTS

| | | | |
|---|---|---|---|
| 2009/0011565 A1* | 1/2009 | Murthy ............... | H01L 29/7848 438/303 |
| 2011/0230030 A1* | 9/2011 | de Souza et al. ............. | 438/303 |
| 2012/0126296 A1* | 5/2012 | Huang ............. | H01L 29/66628 257/288 |
| 2013/0099314 A1* | 4/2013 | Lu et al. ........................ | 257/347 |
| 2013/0146895 A1* | 6/2013 | Tsai et al. ....................... | 257/77 |
| 2013/0277747 A1* | 10/2013 | Liu et al. ....................... | 257/368 |
| 2014/0134818 A1* | 5/2014 | Cheng .............. | H01L 29/66636 438/300 |

* cited by examiner

*Primary Examiner* — Latanya N Crawford

(74) *Attorney, Agent, or Firm* — Heslin Rothenberg Farley & Mesiti P.C.

(57) ABSTRACT

Field-effect transistor and method of fabrication are provided for, for instance, providing a gate structure disposed over a substrate. The fabricating method further includes forming a source and drain region within the substrate separated by a channel region, the channel region underlying, at least partially, the gate structure. Forming further includes implanting at least one dopant at a pre-selected temperature into the source and drain region to facilitate increasing a concentration of the at least one dopant within the source and drain region, where the implanting of the at least one dopant at the pre-selected temperature facilitates reducing contact resistance of the source and drain region and increasing charge carrier mobility through the channel region.

13 Claims, 10 Drawing Sheets

STRESS MODULATION IN FIELD EFFECT TRANSISTORS IN REDUCING CONTACT RESISTANCE AND INCREASING CHARGE CARRIER MOBILITY

TECHNICAL FIELD

The present invention relates to field-effect transistors and methods of fabricating field-effect transistors, and more particularly, to methods for modulating stress within the source and drain regions and/or channel regions, while reducing contact resistance of the source and drain regions to facilitate increasing the mobility of charge carriers within, for example, the channel region of field-effect transistor.

BACKGROUND

The performance of a field-effect transistor may be characterized by its switching speed. One way to increase transistor switching speed is to enhance the mobility of charge carriers in a channel region of the transistor. Stress, such as tensile or compressive stress, may be used to increase the switching speed of the field-effect transistor, because appropriate configurations of stress, for example, tensile and compressive stress, can enhance the mobility of charge carriers, such as electrons and holes.

Enhancements in semiconductor devices such as, for instance, field-effect transistors, and fabrication methods continue to be pursued for enhanced performance and commercial advantage.

BRIEF SUMMARY

Certain shortcomings of the prior art are overcome and additional advantages are provided through the provision, in one aspect, of a method which includes fabricating a field-effect transistor. The fabricating includes: providing a gate structure disposed over a substrate; forming a source and drain region within the substrate separated by a channel region, the channel region underlying, at least partially, the gate structure, and the forming includes implanting at least one dopant at a pre-selected temperature into the source and drain region to facilitate increasing a concentration of the at least one dopant within the source and drain region, where the implanting of the at least one dopant at the pre-selected temperature facilitates reducing contact resistance of the source and drain region and increasing charge carrier mobility through the channel region. The method further includes exposing the drain region below the gate structure and implanting the at least on dopant at the pre-selected temperature into the exposed drain region to facilitate modulating an intrinsic stress disposed within the exposed channel region. The at least one dopant includes a first dopant of a first conductivity type, and the forming further includes forming an epitaxially grown source and drain region having the first dopant of a first conductivity type disposed therein, and the fabricating further includes, subsequent to the forming, implanting a second dopant of a second conductivity type at the pre-selected temperature into an upper surface of the epitaxially grown source and drain region.

Also provided herein, in another aspect is a structure including a field-effect transistor which includes: a gate structure disposed over a substrate; a source and drain region within the substrate separated by a channel region, the channel region underlying, at least partially, the structure; and wherein the source and drain regions further include an increased concentration of at least one dopant within the source and drain region at a pre-selected temperature, which increases an intrinsic stress of the source and drain region. The source and drain regions include epitaxial semiconductor material, the at least one dopant including a first conductivity type disposed in the epitaxial semiconductor material and a second dopant of a second conductivity type implanted at an upper surface of the epitaxial semiconductor material at the preselected temperature.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
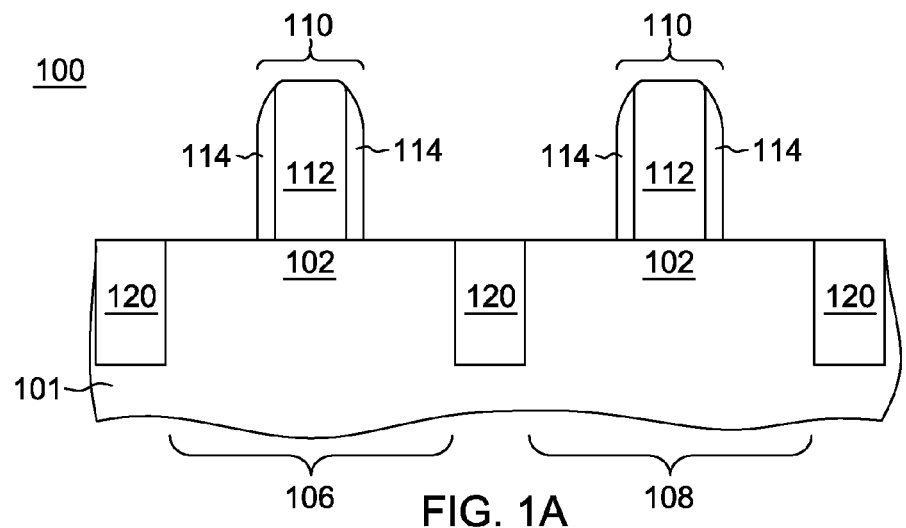
FIG. 1A is a partial cross-sectional elevational view of one embodiment of a field-effect transistor obtained during device fabrication, in accordance with one or more aspects of the present invention.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Further, note that, in making reference below to the drawings (which are not drawn to scale for ease of understanding) the same reference numbers used through-out different figures designate the same or similar components.

Disclosed herein, in part, is a method for modulating stress within the source and drain regions and/or channel regions, while reducing contact resistance of the source and drain regions to facilitate increasing the mobility of charge carriers within, for example, the channel region of field-effect transistor. In operation of a field-effect transistor, when an appropriate voltage is applied on a gate structure, charge carriers (for instance, electrons (generated by n-type dopants)) or holes (generated by p-type dopants) will flow from a source region to a drain region through a channel region. As such, an increase in the mobility of charge carriers in the channel region will allow for a faster switching time of the transistor. One technique to increase mobility of charge carriers is to create stress such as, for example, compressive stress or tensile stress in the vicinity of the channel region so as to produce a corresponding strain in the channel region. Such techniques may be used for both p-type and n-type transistors, because tensile stress increases the mobility of electrons, and compressive stress increases the mobility of holes.

The introduction of stress or strain engineering into integrated circuit fabrication to increase the speed and performance of the field-effect transistors may disadvantageously result in several issues during fabrication process, which could negatively impact performance or yield of the integrated circuits. For example, in forming an integrated circuit, the process of creating stress and/or strain in the channel region by applying a specified external stress may depend on the efficiency of the stress transfer mechanism for the external stress provided by, for instance, contact layers, spacers and the like into the channel region to create the desired stress and/or strain therein. Disadvantageously, the external stress provided by, for instance, strained source and drain regions may result in increasing electrical resistance of the strained source and drain regions which, in turn, results in increasing junction leakage currents of the resultant device(s).

Generally stated therefore, provided herein, in one aspect, is an enhanced method for reducing contact resistance of the source and drain region while increasing carrier mobility through the channel region, for example, during the fabrication of a field-effect transistor. The method includes, for example, providing a gate structure disposed over a substrate; forming a source and drain region within the substrate separated by a channel region, the channel region underlying, at least partially, the gate structure, and the forming including implanting at least one dopant at a pre-selected temperature into the source and drain region to facilitate increasing a concentration of the at least one dopant within the source and drain region, where the implanting of the at least one dopant at the pre-selected temperature facilitates reducing contact resistance of the source and drain region and increasing charge carrier mobility through the channel region.

By way of example, the at least one dopant includes a first dopant of a first conductivity type, and the forming further includes forming an epitaxially grown source and drain region having the first dopant of a first conductivity type disposed within the epixatially grown source and drain region. The fabricating further may include, subsequent to the forming, implanting a second dopant of a second conductivity type at the pre-selected temperature into an upper surface of the epitaxially grown source and drain region. The implanting of the second dopant of the second conductivity type facilitates forming a strained epitaxially grown source and drain region. In one example, the implanting of the second dopant of the second conductivity type may be performed at the pre-selected temperature being within a range of about 300° C. to 700° C. In another example, the implanting of the second dopant of the second conductivity type may be performed at the pre-selected temperature being within a range of about −20° C. to −100° C.

In one aspect, the first dopant of the first conductivity type, for instance, disposed within the epitaxially grown source and drain region may include or be fabricated of a first dopant material and, the second dopant of the second conductivity type being implanted at the pre-selected temperature into an upper surface of the epitaxially grown source and drain region may include or be fabricated of a second dopant material, the first dopant material and the second dopant material being the same dopant material. In one example, the same dopant material may be or include, for instance, an n-type dopant such as, for example, phosphorus, antimony or arsenic. In another example, the same dopant material may be or include a p-type dopant such as, for example, boron, aluminum, gallium. The implanting of the second dopant of the second conductivity type at the pre-selected temperature facilitates reducing junction leakage current as well as minimizing interstitial defects within a crystal lattice structure of a material of the field-effect transistor.

In another aspect, the implanting facilitates creating an intrinsic stress within the source and drain region as well as increasing carrier mobility through the channel region. By way of example, the method may further include implanting, subsequent to the forming of the source and drain region, the at least one dopant at the pre-selected temperature into a gate material of the gate structure. The implanting of the at least one dopant into the gate material may facilitate modulating an intrinsic stress of the gate structure. In further embodiment, the implanting may further include performing an annealing process, subsequent to the implanting of the at least one dopant, the annealing process facilitating memorizing stress within the channel region or the source and drain region separated by the channel region. The at least one dopant being implanted into the gate material may include or be fabricated of a stress-inducing dopant which, for instance, may be electrically inactive such as, for example, germanium, carbon, arsenic or silicon. The implanting of the stress-inducing dopant into the gate material of the gate structure may be performed at the pre-selected temperature within a range of about 300° C. to 700° C. In another embodiment, the implanting of the stress-inducing dopant into the gate material of the gate structure may be performed at the pre-selected temperature being within a range of about −20° C. to −100° C.

In another embodiment, the fabricating method may further include exposing the channel region, and the method may further implanting the at least one dopant at the pre-selected temperature into the exposed channel region to facilitate modulating an intrinsic stress disposed within the exposed channel region. The at least one dopant being implanted into the exposed channel region may include or be fabricated of a stress-inducing dopant such as, for example, germanium, carbon, arsenic or silicon. In one example, the implanting of the stress-inducing dopant into the exposed channel region may be performed at the pre-selected temperature within a range of about 300° C. to 700° C. In another embodiment, the implanting of the stress-inducing dopant into the exposed channel region may be performed at the pre-selected temperature being within a range of about −20° C. to −100° C.

In another embodiment, the fabricating method may further include forming a non-epitaxially grown source and drain region within the substrate with, for instance, implanting the at least one dopant at the pre-selected temperature into the non-epitaxially grown source and drain region to facilitate modulating an intrinsic stress within the non-epitaxially grown source and drain region. In one example, the implanting may include implanting a source and drain dopant into the substrate at the pre-selected temperature, and the fabricating method may further include implanting a stress-inducing dopant along with the source and drain dopant into the substrate at the pre-selected temperature. The stress-inducing dopant may include or be fabricated of a first dopant which, for instance may be electrically inactive, such as, for example, carbon or germanium and the source and drain dopant may include or be fabricated of a second dopant such as, for example, an n-type dopant or a p-type dopant. The first dopant and the second dopant may be different dopant materials. In one example, the implanting of the stress-inducing dopant along with the source and drain dopant into the substrate may be performed at the pre-selected temperature within a range of about 300° C. to 700° C. or about −20° C. to −100° C.

FIGS. 1A-1G depicts an example of an enhanced method for fabricating a fin-type field effect transistor. Advantageously, as described below, the implanting of the at least one dopant at a pre-selected temperature into the source and drain region facilitates modulating stress within the source and drain region, while reducing contact resistance of the source and drain region and increasing charge carrier mobility through the channel region during, for instance, subsequent fabrication processing, in accordance with one or more aspects of the present invention.

Referring to FIG. 1A, a partial cross-sectional elevational view is shown of a structure 100 obtained during one embodiment of a method for fabricating a field-effect transistor, such as a planar field-effect transistor or fin-type field-effect transistor. In the illustrated example, a substrate 101, which may be a semiconductor substrate is provided, and may include a plurality of transistors, for instance, N-type field-effect transistor (NFET) 106 (referred to, hereafter, as n-type transistor) and P-type field-effect transistor (PFET) 108 (referred to hereafter, as p-type transistor) formed over substrate 101. Although not critical to the invention, n-type transistor 106 and p-type transistor 108 may further include, for instance, gate structure(s) 110 overlying a channel region 102 within substrate 101. By way of example, gate structure(s) 110 may be a sacrificial gate structure for use in a gate-last process, in which gate structures are provided after establishment of the source and drain region of the field-effect transistor. In one embodiment, gate structure(s) 110 includes, by way of example only, a sacrificial gate material 112 (such as poly-silicon), and sidewall spacers 114 (formed, for example, from an oxide material). If desired, a gate cap (not shown) may be provided over sacrificial gate material 112. Note that in another embodiment, gate structure(s) 110 could be a gate structure of a typical gate-first process, in which gate structures are provided after establishment of the source and drain regions of the transistor. In such a case, the sacrificial gate material would be replaced by one or more gate metals disposed above a gate dielectric, both of which may be surrounded or protected by sidewall spacers 114. An isolation region 120, such as shallow trench isolation, may at least partially surround the field-effect transistor.

By way of example, substrate 101 may be a bulk semiconductor material such as a bulk silicon wafer. As another example, the substrate 101 may include or be a silicon-containing substrate including, but not limited to, silicon (Si), single crystal Si, polycrystalline Si, amorphous Si, silicon-on-nothing (SON), silicon-on-insulator (SOI), or silicon-on-replacement insulator (SRI) substrate or the like, and may be N-type or P-type doped, as desired for a particular application. Substrate 101 may in addition or instead include various isolations, dopings and/or device features. The substrate may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including: GaAsP, AlInAs, GaInAs, or GaInAsP, or combinations thereof. In another example, substrate 101 may include multiple layers of material.

In another embodiment, substrate 101 may include one or more three dimensional fin structures, which extend from the substrate. In such a case, the gate structures may wrap up, over, and down the fin structure, so that a control voltage may be applied at two or more surfaces of the fin structure, and in particular, to two or more surfaces of a channel region of the fin structure, allowing for a greater current to flow through the structure between a source region and a drain region during operation.

Figure 1B:
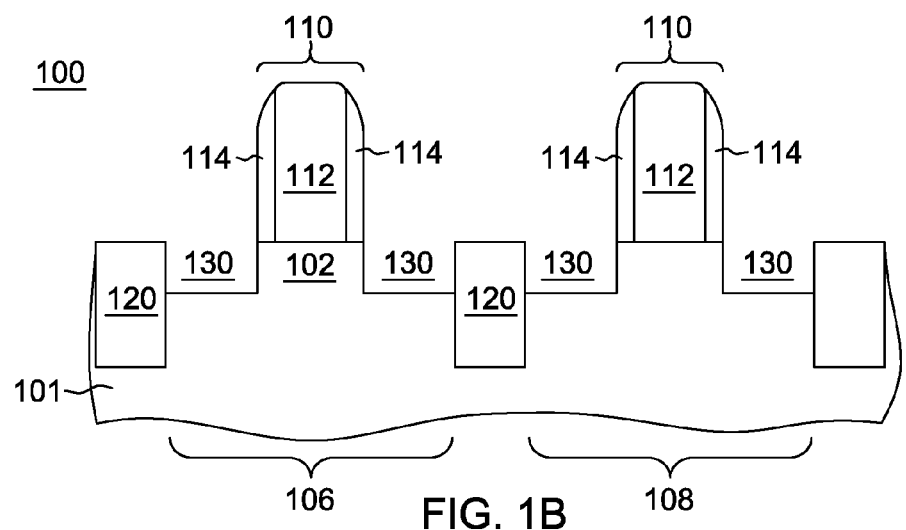
FIG. 1B depicts the structure of FIG. 1A, after recessing a substrate of the field-effect transistor to form source and drain cavities therein, in accordance with one or more aspects of the present invention.

As illustrated in FIG. 1B, substrate 101 may be recessed adjacent to channel region 102 to form one or more cavities 130 therein, including, for instance, a source cavity and a drain cavity, separated by the channel region. A variety of processing techniques may be employed to pattern substrate 101, and remove material thereof to form cavities 130. For example, substrate 101 may be patterned using direct lithography, sidewall image transfer techniques, extreme ultra-violet lithography (EUV), e-beam techniques, litho-etch techniques, or litho-etch-litho-freeze techniques. Removal of material may be accomplished using any suitable removal process, such as an etching process with an etchant selected to etch, for instance, the material of the substrate. In one specific example, reactive ion etching may be performed using fluorine-based chemistry, and gases such as tetrafluoromethane ($CF_4$), trifluoromethane ($CHF_3$), difluoromethane ($CH_2F_2$), fluoromethane ($CH_3F$), octofluoromethane ($C_4F_8$), hexafluoro-1,3-butadiene ($C_4F_6$), sulfur hexafluoride ($SF_6$), oxygen and the like. In one implementation, cavities 130 may have other shapes, and may have angular sidewalls. In one specific implementation, cavities 130 may be sigma cavities, which are named for the resemblance between the Greek-letter Σ (sigma) and the profile of its angular sidewalls planes, which may include {111}, {110}, and/or {100} planes.

Figure 1C:
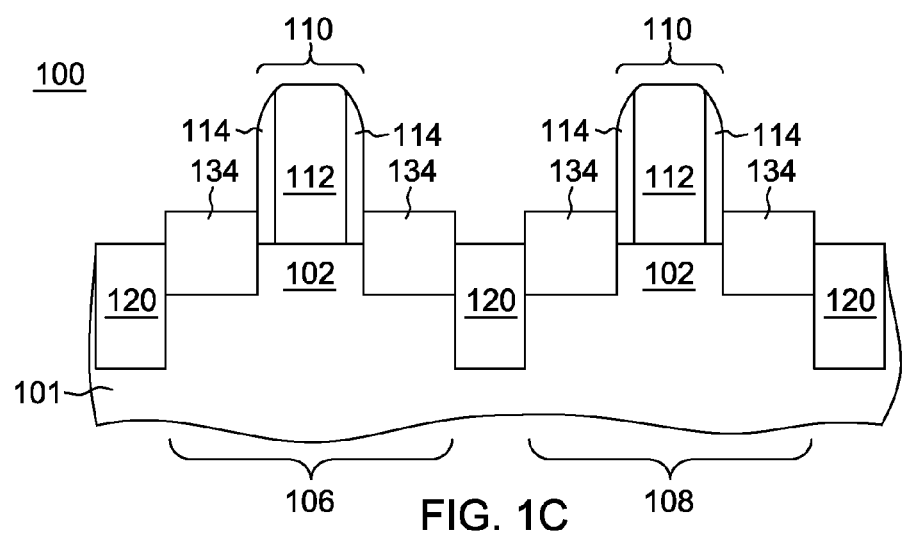
FIG. 1C depicts the structure of FIG. 1B, after forming source and drain regions, at least partially, within the source and drain cavities, in accordance with one or more aspects of the present invention.

FIG. 1C illustrates the structure of FIG. 1B after forming source and drain regions 134, at least partially, within source and drain cavities 130 (FIG. 1B). In one embodiment, source and drain regions 134 may be formed by, for instance, epitaxially growing a source and drain material from the exposed semiconductor material of substrate 101 within source and drain cavities 130 (FIG. 1B). Epitaxial growing refers to the orderly growth of a crystalline material, where the grown material arranges itself in the same crystal orientation as the underlying structure. In one example, the source and drain material may be epitaxially grown using selective epitaxial growth via various methods such as, for example, CVD, low-pressure CVD (LPCVD), or other applicable methods. By way of example, in the case of n-type transistor 106, the source and drain regions 134 may be silicon-based epitaxy, and in the case of p-type transistor 108, the source and drain regions 134 may be doped silicon germanium-based epitaxy.

Figure 1D:
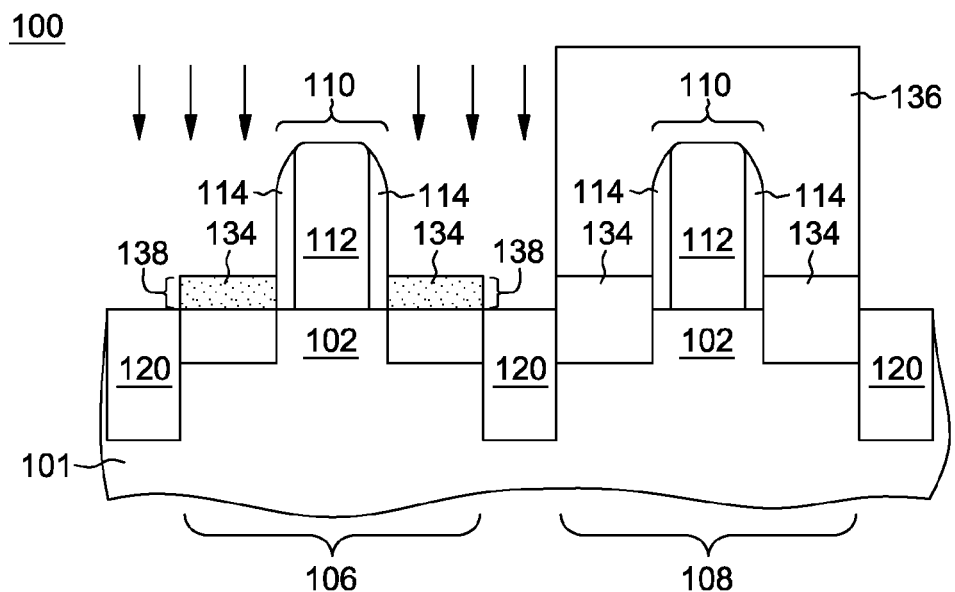
FIG. 1D depicts the structure of FIG. 1C, after exposing n-type transistor, while overlying p-type transistor with a protective layer and implanting the exposed n-type transistor, in accordance with one or more aspects of the present invention.

FIG. 1D depicts the structure of FIG. 1C, after exposing n-type transistor 106, while overlying p-type transistor 108 with a protective layer 136, for instance, to facilitate selectively implanting a dopant within source and drain region of n-type transistor 106. This protective layer 136 protects p-type transistor 108 from ion implantation processing to be subsequently performed within the n-type transistor. In one embodiment, protective layer 136 may include or be fabricated of a material such as, for instance, a nitride material, an oxide material or a silicon-containing material such as, for example, silicon nitride (SiN), silicon oxide ($SiO_2$), an oxynitride (SiON), silicon carbide (SiC), oxy-silicon carbide (SiOC), amorphous carbon, amorphous silicon or silicon-rich anti-reflective coating (SiARC) layer or any combinations thereof. The deposition processes may include any conventional process such as, for example, low temperature CVD, PECVD, or ALD. In one specific example, silicon nitride may be deposited using process gases such as, for example, dichlorosilane ($SiH_2Cl_2$) and ammonia ($NH_3$) and using known process conditions. In a further example, a low-pressure CVD or ALD-created mask may be used to form the protective layer. In other examples, other hard-mask materials, such as metal-oxides or metals, may be used.

Continuing with FIG. 1D, an upper portion of n-type transistor 106, and in particular, epitaxially grown source and drain region 134 of the n-type transistor may be implanted with a dopant to increase concentration of the dopant within the source and drain region forming a strained epitaxially grown source and drain region 138, in accordance with one or more aspects of the present invention. By way of example, the dopant being implanted may be or include, for instance, a dopant similar to the dopant disposed within the epitaxially grown source and drain region 134. In this example, the dopant may include or be fabricated of an n-type dopant. As used herein, an n-type dopant refers to the addition of impurities to the epitaxially grown source and drain region of n-type transistor 106 (including, for instance, an intrinsic semiconductor material), which contributes more electrons to the intrinsic material, and may include (for instance) phosphorus, antimony or arsenic. In one example, n-type transistor 106 may be implanted with, for instance, an n-type active dopant such as, for instance, phosphorus or a compound of phosphorus (for instance, heptaphosphane ($P_7H_3$)), by employing an implantation dose of about 1e15 to 6e15 $cm^{-2}$, with an implantation energy of about 5 to 10 keV, to increase the concentration of n-type dopant within source and drain region 134 forming strained epitaxially grown source and drain region 138. In such an example, the concentration of n-type dopants implanted within upper portion 138 of source and drain 134 may be within the range of about 1e21 to 6e21 $cm^{-3}$.

In one embodiment, source and drain region 134 of n-type transistor 106 has been implanted with the n-type dopant via, for instance, an ion implantation process employing controlled process parameters such as, for example, implantation energy and/or implantation dose at a pre-selected temperature, so as to facilitate implanting only the upper portion of the source and drain region to increase the concentration of the dopant within the upper portion of the source and drain region, as illustrated. In one example, the dopant may be implanted into the source and drain region to a depth of about 5 to 20 nm.

Further, as discussed above, the ion implantation process has been performed at pre-selected temperature conditions so as to facilitate achieve a desired concentration of the dopant within the upper portion of the source and drain region, while minimizing or inhibiting undesirable pre-amorphization damage within the semiconductor material of the source and drain region. In one example, the ion implantation process may be accomplished by selecting the process temperature to be above a room temperature, and in particular, within a range of about 300° C. to 700° C. so as to facilitate minimizing the interstitial defects within a crystal lattice structure of the semiconductor material of the source and drain region. In another example, the ion implantation process may also be accomplished by selecting the process temperature to be below the room temperature, and in particular, within a range of about −20° C. to −100° C. This increase in the concentration of the dopants within the upper portion of the source and drain region advantageously facilitates modulating intrinsic strain within the source and drain region, while reducing a contact resistance of the source and drain region, for instance, during subsequent fabrication processing. This reduced or minimized contact resistance of the source and rain region, in turn, facilitates reducing the junction leakage current of the resultant device. For instance, the increase in the concentration of the dopants within the upper portion of the source and drain region advantageously decreases a parasitic resistance of the source and drain region within a range of about 5% to 10%.

Figure 1E:
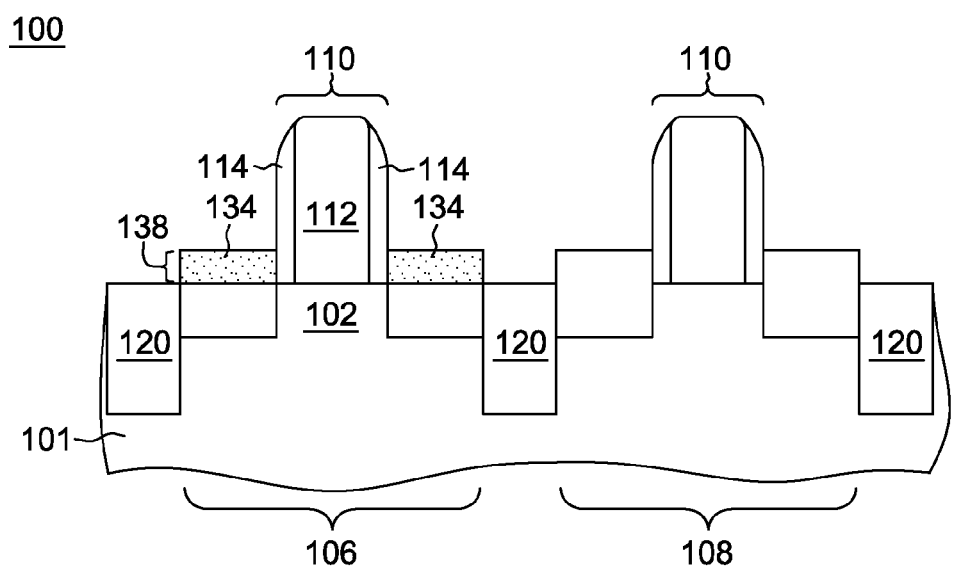
FIG. 1E depicts the structure of FIG. 1D, after removal of the protective layer, in accordance with one or more aspects of the present invention.

As depicted in FIG. 1E, protective layer 136 (see FIG. 1D) disposed over p-type transistor 108 may be removed, in accordance with one or more aspects of the present invention. The protective layer may be removed by any suitable etching process, such as, for example, anisotropic dry etching processing for instance, reactive ion etching (RIE).

Figure 1F:
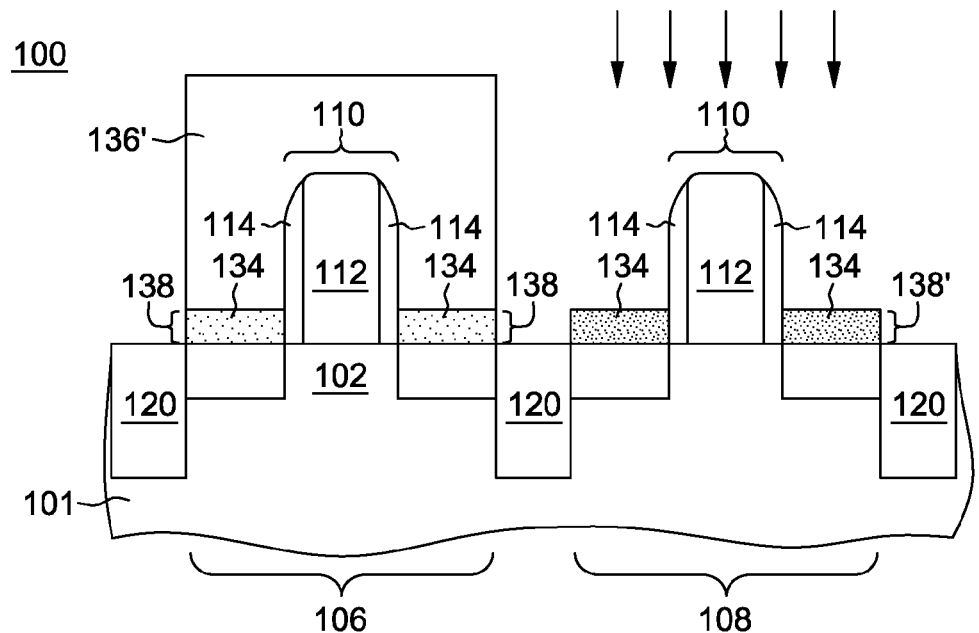
FIG. 1F depicts the structure of FIG. 1E, after providing a protective layer over the n-type transistor to, for instance, facilitate selectively implanting at least one dopant within the p-type transistor, in accordance with one or more aspects of the present invention.

FIG. 1F illustrates the structure of FIG. 1E with a further protective layer 136' having been provided over n-type transistor 106 to, for instance, facilitate selectively implanting p-type transistor 108, and in particular, the source and drain region 134 of p-type transistor 108. Additional protective layer 136' may be provided using any of the techniques described above with regard to protective layer 136 (FIG. 1D) provided over the p-type transistor. In another example, and depending on the process steps involved, n-type transistor 106 may be implanted simultaneously with p-type transistor 108, obviating the need for a second implanting step using additional protective layer 136'.

Continuing with FIG. 1F, an upper portion of p-type transistor 108, and in particular, epitaxially grown source and drain region 134 may be implanted with a dopant to increase concentration of the dopant within the source and drain region forming a strained epitaxially grown source and drain region 138'. By way of example, the dopant may include or be fabricated of a dopant material similar to that disposed within the epitaxially grown source and drain region. For instance, the dopant may be or include a p-type dopant. As used herein, the p-type dopant refers to the addition of an impurity to the source and drain region of p-type transistor (comprising, for instance, an intrinsic semiconductor material) to create deficiencies of valence electrons. Examples of a p-type dopant may include boron, aluminum, gallium or indium, any one or more of which may be added to source and drain region 134 of p-type transistor including, for instance, silicon material. In one example, source and drain region 134 may be implanted with, for instance, a p-type active dopant such as, for instance, boron or a compound of boron (for instance, boron trifluoride ($BF_3$), octadecaborane ($B_{18}H_{22}$)), by employing an implantation dose of about 1e15 to 6e15 $cm^{-2}$, with an implantation energy of about 1.5 to 3 keV, to increase a concentration of p-type dopant within the upper portion of source and drain region 134 of p-type transistor 108. In such an example, the concentration of p-type dopants implanted within source and drain region may be within a range of about 8e20 to 2e21 $cm^{-2}$.

As discussed above, in one embodiment, source and drain region 134 of p-type transistor 108 has been implanted with the p-type dopant via, for instance, an ion implantation process employing controlled process parameters such as, for example, implantation energy and/or implantation dose at a pre-selected temperature, so as to facilitate implanting only the upper portion of the source and drain region to increase the concentration of the p-type dopant within the upper portion of the source and drain region, as illustrated. In one example, the p-type dopant may be implanted into the source and drain region to a depth of about 5 to 20 nm.

Further, the ion implantation process may be performed at pre-selected temperature conditions so as to facilitate achieve a desired concentration of the dopant within the upper portion of the source and drain region, while minimizing or inhibiting undesirable pre-amorphization damage within the semiconductor material of the source and drain region, during subsequent fabrication processing. In one example, the ion implantation process may be accomplished by selecting the process temperature to be above a room temperature, and in particular, within a range of about 300° C. to 700° C., so as to facilitate minimizing the interstitial defects within a crystal lattice of the semiconductor material of the source and drain region. In another example, the ion implantation process may also be accomplished by selecting the process temperature to be below the room temperature, and in particular, within a range of about −20° C. to −100° C. This increase in the concentration of the dopants within the upper portion of the source and drain region advantageously facilitates modulating intrinsic strain within the source and drain region, while reducing a contact resistance of the source and drain region, for instance, during subsequent fabrication processing. This reduced or minimized contact resistance of the epitaxially grown source and drain, in turn, facilitates reducing the junction leakage current of the resultant device. For instance, the increase in the concentration of the dopants within the upper portion of the source and drain region advantageously decreases parasitic resistance of the source and drain region within a range of about 5% to 10%.

Figure 1G:
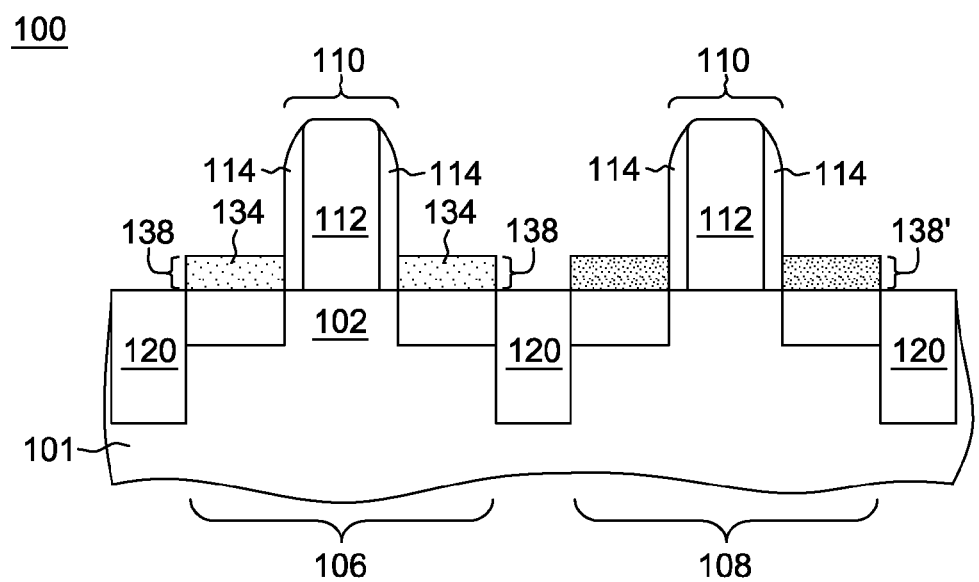
FIG. 1G depicts the structure of FIG. 1F, after removal of the protective layer, in accordance with one or more aspects of the present invention.

As depicted in FIG. 1G, protective layer 136' (see FIG. 1G) disposed over n-type transistor 106 may be removed, in accordance with one or more aspects of the present invention. The protective layer may be removed by any suitable etching process, such as anisotropic dry etching processing, for instance RIE.

Continuing with FIG. 1G, structure 100 may optionally be subjected to an annealing process to facilitate diffusing of the dopant(s) within n-type transistor 106 and p-type transistor 108, and in particular, the source and drain region of the n-type and p-type, to achieve a desired configuration and distribution of the dopants within strained epitaxially source and drain regions 138 and 138', respectively. The crystal lattice structure of the source and drain regions, for instance, may be altered during the ion (i.e., active dopant) implantation process, resulting in the implanted dopant being weakly bound to the source and drain region. Upon performing a high temperature annealing process, the crystal lattice structure of the source and drain material may be adjusted to better position the implanted dopants into the crystal lattice structure of the epitaxially grown source and drain regions, thereby stabilizing the implanted dopants within the source and drain regions. The high temperature annealing process may be performed using, for instance, a spike annealing, laser annealing, rapid thermal annealing (RTA), flash annealing or the like. In one example, this annealing process may be performed using rapid thermal annealing process at an elevated temperature of about 950° C. to 1100° C. in the presence of inert gas such as, Argon (Ar), at atmospheric pressure. In one embodiment, as discussed above, the increased concentration of the implanted dopants within the upper portion of epitaxially grown source and drain regions advantageously facilitates in increasing an intrinsic strain of the epitaxially grown source and drain regions, while reducing contact resistance of the epitaxially grown source and drain regions during subsequent fabrication processing.

Figure 2A:
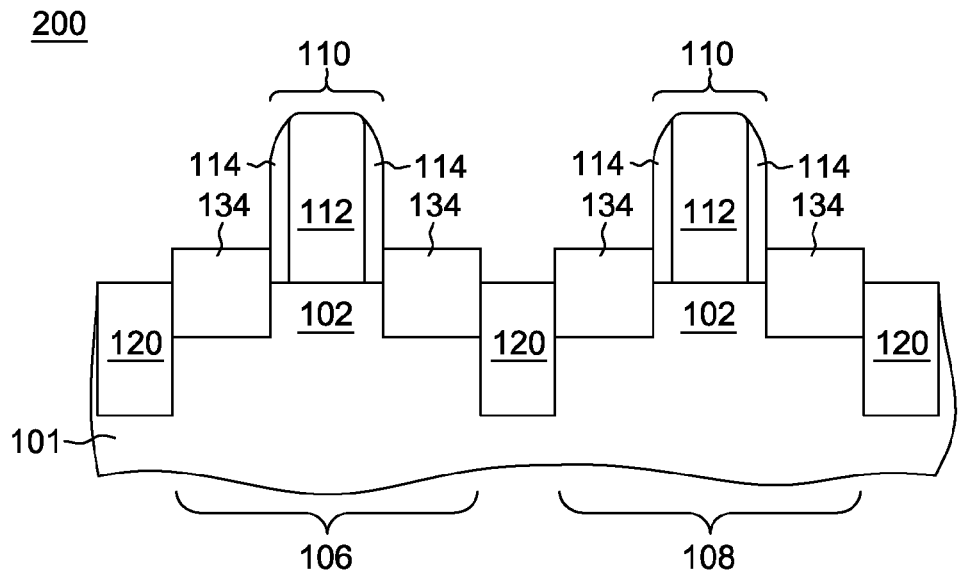
FIG. 2A is a cross-sectional elevational view of a structure obtained during another field-effect transistor fabrication process, in accordance with one or more aspects of the present invention.
Figure 2B:
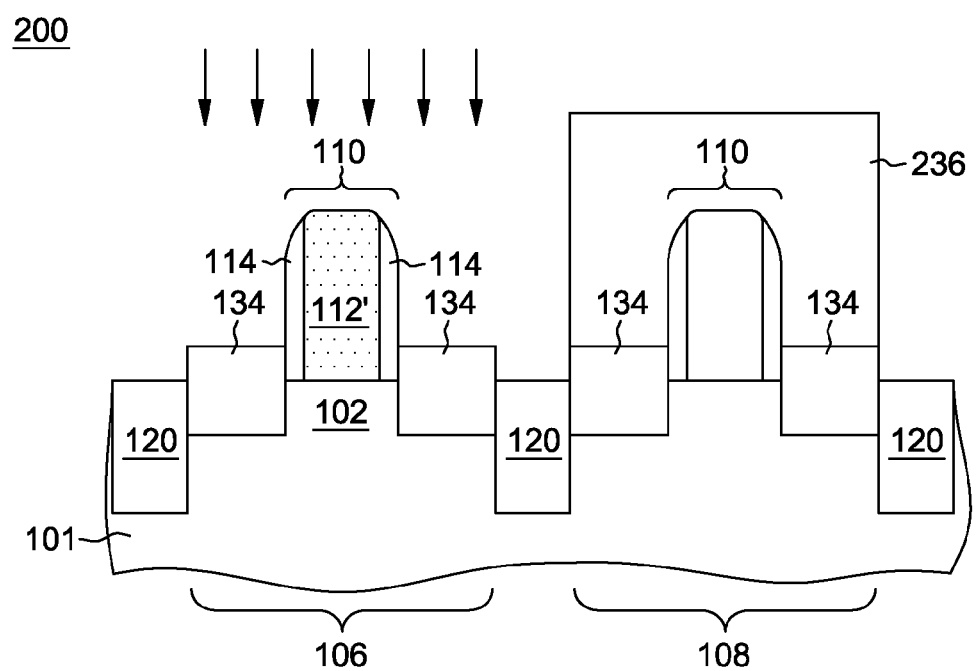
FIG. 2B depicts the structure of FIG. 2A, after exposing n-type transistor, while overlying p-type transistor with a protective layer and implanting the gate structure of n-type transistor, in accordance with one or more aspects of the present invention.
Figure 2C:
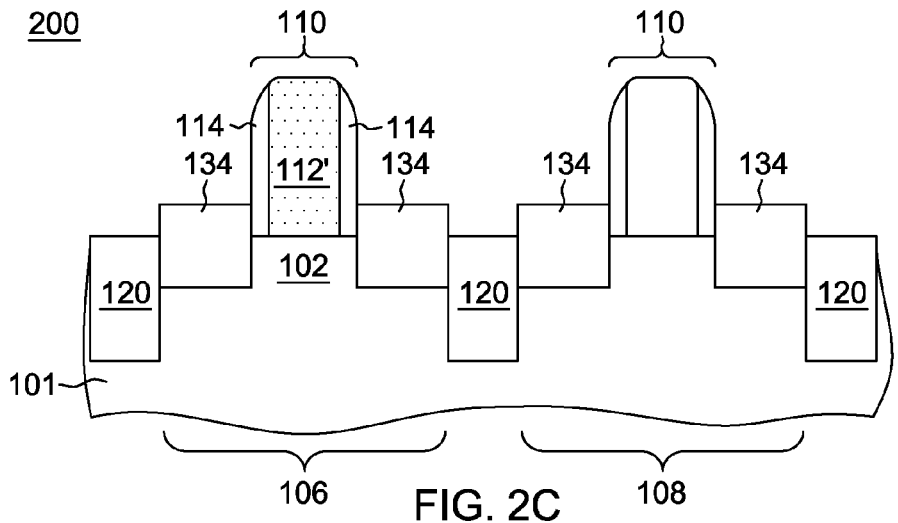
FIG. 2C depicts the structure of FIG. 2B, after removal of the protective layer, in accordance with one or more aspects of the present invention.

FIGS. 2A-2C depicts another example of an enhanced method for fabricating a fin-type field effect transistor. Advantageously, as described below, the implanting of the at least one dopant at a pre-selected temperature into the gate structure facilitates modulating an intrinsic stress of the gate structure which, in turn, facilitates memorizing residual stress within the channel region and/or the source and drain region separated by the channel region, in accordance with one or more aspects of the present invention.

Referring to FIG. 2A, structure 200 is illustrated similar or identical to structure 100 of FIG. 1C of the above-described processing flow. Briefly, structure 200 includes substrate 101, along with a plurality of transistors, for instance, N-type field-effect transistor (NFET) 106 (referred to herein as n-type transistor) and P-type field-effect transistor (PFET) 108 (referred to herein as p-type transistor) formed over the substrate. As noted, substrate 101 may be or include a semiconductor material, such as described in connection with FIGS. 1A-1C. The n-type transistor 106 and p-type transistor 108 may further include, for instance, gate structure(s) 110 overlying channel region 102 within substrate 101. In this example, gate structure(s) 110 includes sacrificial gate material 112 (such as polysilicon), and sidewall spacers 114, as described above. Substrate 101 is recessed adjacent to channel region 102 to form one or more source and drain regions 134, and in particular, epitaxially grown source and drain regions 134, as illustrated. Isolation region 120, such as shallow trench isolation, at least partially surrounds the transistor, which as noted, may be a planar field-effect transistor or fin-type, field-effect transistor.

FIG. 2B depicts the structure of FIG. 2A, after exposing n-type transistor 106, while overlying p-type transistor 108 with a protective layer 236, for instance, to facilitate selectively implanting a stress-inducing dopant within gate material 112 of gate structure 110 of n-type transistor 106. This protective layer 236 protects p-type transistor 108 from ion implantation processing to be subsequently performed within the n-type transistor. In one embodiment, protective layer 236 may include or be fabricated of a material such as, for instance, a nitride material, an oxide material or a silicon-containing material such as, for example, silicon nitride (SiN), silicon oxide ($SiO_2$), or an oxynitride (SiON), silicon carbide (SiC), oxy-silicon carbide (SiOC), amorphous carbon, amorphous silicon or silicon-rich anti-reflective coating (SiARC) layer or any combinations thereof. The deposition processes may include any conventional process such as, for example, low temperature CVD, PECVD, or ALD. In one specific example, silicon nitride may be deposited using process gases such as, for example, dichlorosilane ($SiH_2Cl_2$) and ammonia ($NH_3$) and using known process conditions. In a further example, a low-pressure CVD or ALD-created mask may be used to form the protective layer. In other examples, other hard-mask materials, such as metal-oxides or metals, may be used.

Continuing with FIG. 2B, gate structure 110 of n-type transistor 106 may be implanted with a stress-inducing dopant to facilitate modulating an intrinsic stress of the gate structure by forming a strained gate structure 112'. By way of example, the stress-inducing dopant may include or be fabricated of an electrically inactive dopant such as, for instance, germanium, arsenic or silicon. In one embodiment, the stress-inducing dopant within the gate structure may be designed to, for instance, modulate an intrinsic stress of the gate material of the gate structure. By way of example, gate structure 110 may be implanted with a stress-inducing dopant such as, for instance, germanium or a compound of germanium (for instance, germane ($GeH_4$)), employing an implantation dose of about 5e14 atom/$cm^2$, with an implantation energy of about 10 to 20 keV and at a temperature within a range of about 300 to 700° C., to provide a concentration of stress-inducing dopant within gate structure 110. For instance, the concentration of germanium ions implanted within gate structure 110 may be in the range of about 3e14 to 1e15 atom/$cm^3$. In another example, gate structure 110 may be implanted with a stress-inducing dopant such as, for instance, arsenic or a compound of arsenic (for instance, arsine ($AsH_3$)), employing an implantation dose of about 3e14 to 1e15 atom/$cm^2$, with an implantation energy of about 10 to 20 keV and at a temperature within a range of about 300 to 700° C., to provide a concentration of stress-inducing dopant within the gate structure.

By way of example, the stress-inducing dopant may be implanted into the gate structure via, for example, an ion implantation process employing controlled process parameters such as, for instance, implantation dose and/or implantation energy at a pre-selected temperature conditions so as to facilitate modulating the intrinsic stress of the gate structure, while minimizing or preventing undesirable pre-amorphization damage within the gate material of the gate structure. In one example, the ion implantation process may be accomplished by selecting the process temperature to be above a room temperature, and in particular, within a range of about 300° C. to 700° C. so as to facilitate minimizing the interstitial defects within a crystal lattice structure of the gate material. In another example, the ion implantation process may also be accomplished by selecting the process temperature to be below the room temperature, and in particular, within a range of about −20° C. to −100° C.

As depicted in FIG. 2C, protective layer 236 (see FIG. 2B) disposed over p-type transistor 108 may be removed, in accordance with one or more aspects of the present invention. The protective layer may be removed by any suitable etching process, such as, for example, anisotropic dry etching processing for instance, RIE.

Continuing with FIG. 2C, structure 200 may optionally be subjected to an annealing process to facilitate transferring stress from the gate structure to induce and simultaneously memorize residual stress (also referred to as stress memorization technique (SMT)) within channel region 102 or source and drain region 134 separated by channel region 102, in accordance with one or more aspects of the present invention. The crystal lattice structure of the gate material, for instance, may be altered during the ion implantation process, resulting in the implanted dopant being weakly bound to the gate material. Upon performing a high temperature annealing process, the crystal lattice structure of the gate material may be adjusted to better position the implanted dopants into the crystal lattice structure of the gate structure which, in turn, may increase a thermal expansion coefficient of the gate material. This increase in the thermal expansion coefficient of the gate material may advantageously facilitate inducing residual stress within the channel region and/or source and drain region separated by the channel region. Further, this high temperature annealing process may facilitate memorizing the residual stress within the channel region and/or source and drain region. The high temperature annealing process may be performed using, for instance, a spike annealing, laser annealing, rapid thermal annealing (RTA), flash annealing or the like. In one example, this annealing process may be performed using rapid thermal annealing process at an elevated temperature of about 950° C. to 1200° C. in the presence of inert gas such as, Argon (Ar) at, for instance, an atmospheric pressure.

One skilled in the art will know that such memorizing of the residual stress (SMT) may only be performed within n-type transistor 106, for instance, by implanting stress-inducing dopant into the gate structure, thereby facilitating increasing volume of the gate structure which, in turn, causes a tensile stress within the channel region so as to facilitate increase the charge carrier mobility within the channel region. Additionally, the volume of the gate structure of p-type transistor 108 would be required to remain unaffected and hence, is protected, for instance, during the above-described implanting of the stress-inducing dopant.

Figure 3A:
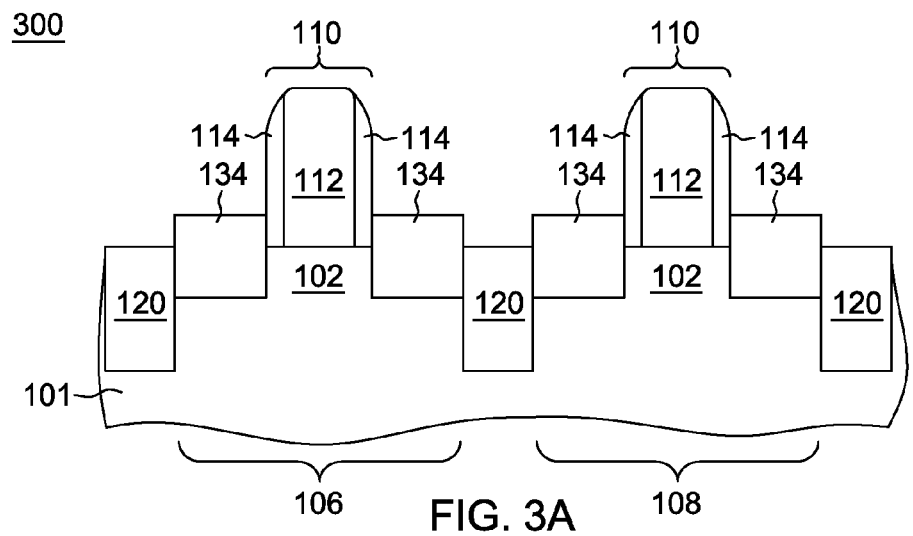
FIG. 3A is a cross-sectional elevational view of a structure obtained during another field-effect transistor fabrication process, in accordance with one or more aspects of the present invention.
Figure 3B:
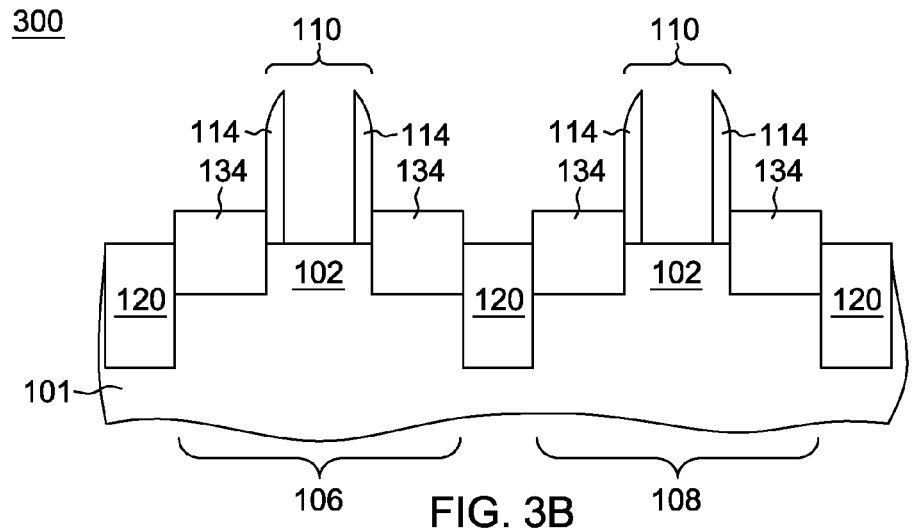
FIG. 3B depicts the structure of FIG. 3A, after removal of gate structure to, for instance, expose the channel region thereof, in accordance with one or more aspects of the present invention.
Figure 3C:
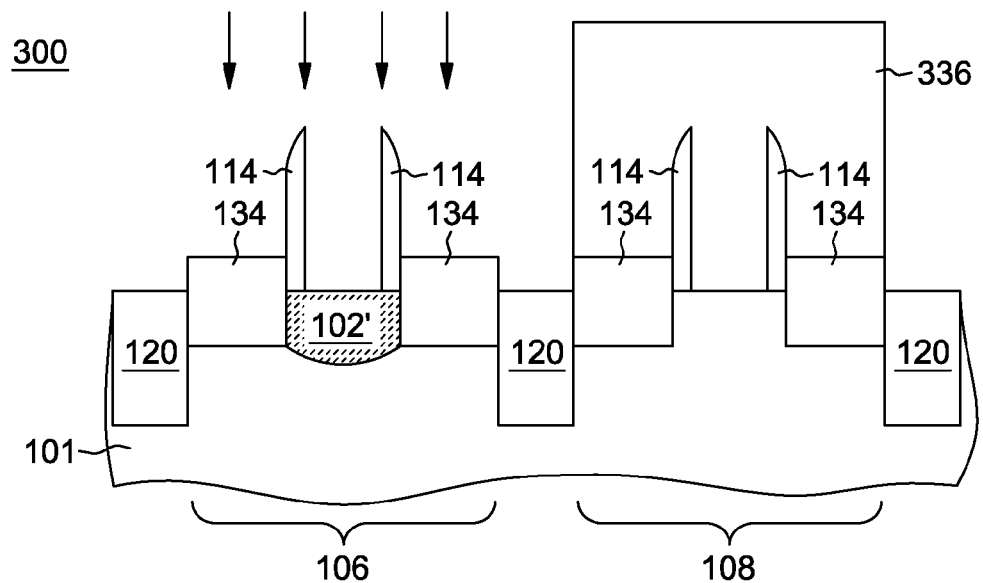
FIG. 3C depicts the structure of FIG. 3B, after exposing n-type transistor, while overlying p-type transistor with a protective layer and implanting the channel region of n-type transistor, in accordance with one or more aspects of the present invention.

FIGS. 3A-3C depicts another example of an enhanced method for fabricating a fin-type field effect transistor. Advantageously, as described below, the implanting of the at least one dopant at a pre-selected temperature into the channel region facilitates modulating an intrinsic stress of the channel region, in accordance with one or more aspects of the present invention.

Referring to FIG. 3A, structure 300 is illustrated similar or identical to structure 100 of FIG. 1C of the above-described processing flow. Briefly, structure 300 includes substrate 101, along with a plurality of transistors, for instance, N-type field-effect transistor (NFET) 106 (referred to herein as n-type transistor) and P-type field-effect transistor (PFET) 108 (referred to herein as p-type transistor) formed over the substrate. As noted, substrate 101 may be or include a semiconductor material, such as described in connection with FIGS. 1A-1C. The n-type transistor 106 and p-type transistor 108 may further include, for instance, gate structure(s) 110 overlying channel region 102 within substrate 101. In this example, gate structure(s) 110 includes sacrificial gate material 112 (such as polysilicon), and sidewall spacers 114, as described above. Substrate 101 is recessed adjacent to channel region 102 to form one or more source and drain regions 134, and in particular, epitaxially grown source and drain regions 134, as illustrated. Isolation region 120, such as shallow trench isolation, at least partially surrounds the transistor, which as noted, may be a planar field-effect transistor or fin-type, field-effect transistor.

FIG. 3B illustrates the structure of FIG. 3A after the removal of the gate material 112 (FIG. 3A) to facilitate exposing channel region 102 underlying gate structure 110. The gate material may be removed by any suitable etching process such as, for instance, combination of isotropic and anisotropic dry etching processing, for instance, RIE, and/or wet etching processes.

FIG. 3C illustrates the structure of FIG. 3B after exposing channel region 102 (FIG. 3B) of n-type transistor 106 while overlying p-type transistor 108 with a protective layer 336. This protective layer 336 protects p-type transistor 108 from ion implantation processing to be subsequently performed within the n-type transistor. In one embodiment, protective layer 336 may include or be fabricated of a material such as, for instance, a nitride material, an oxide material or a silicon-containing material such as, for example, silicon carbide (SiC), oxy-silicon carbide (SiOC), amorphous carbon, amorphous silicon or silicon-rich anti-reflective coating (SiARC) layer or any combinations thereof. The deposition processes may include any conventional process such as, for example, low temperature CVD, PECVD, or ALD. In a further example, a low-pressure CVD or ALD-created mask may be used to form the protective layer. In other examples, other hard-mask materials, such as metal-oxides or metals, may be used.

Continuing with FIG. 3C, the exposed channel region of n-type transistor 106 may be implanted with one or more stress-inducing dopants, such as one or more tensile stress-inducing dopants, to modulate an intrinsic stress of the exposed channel region by forming an implanted channel region 102'. In one example, the tensile stress of n-type transistor may be modulated by implanting the exposed channel region with one or more tensile stress-inducing dopants which may include or be fabricated of an electrically inactive dopant such as, for example, carbon. The term "tensile stress-inducing dopant" denotes a dopant having an intrinsic tensile stress, in which the intrinsic tensile stress produces a tensile stress in one or more adjacent materials. For instance, a tensile stress-inducing dopant may be a dopant having an intrinsic compressive stress, in which the intrinsic compressive stress produces a tensile stress in one or more adjacent materials, or a dopant with a larger lattice constant and volume than the adjacent material that is lattice-matched to the stress-inducing dopant. In one example, the exposed channel region of n-type transistor 106 may be implanted with a carbon-containing stress-inducing dopant such as, for example, silicon carbide (SiC), employing an implantation dose of about 5e15 to 1e16 cm$^{-2}$ and an implantation energy of about 5 to 10 keV at a temperature of about 300 to 700° C., to provide a concentration of carbon-containing stress-inducing dopant within the channel region to form implanted channel region 102'.

By way of example, the stress-inducing dopant may be implanted into the channel region via, for example, an ion implantation process employing controlled process parameters such as, for instance, implantation dose and/or implantation energy at a pre-selected temperature conditions so as to facilitate modulating the intrinsic stress of the channel region, while minimizing or preventing undesirable pre-amorphization damage within implanted channel region 102' of n-type transistor 106. In one example, the ion implantation process may be accomplished by selecting the process temperature to be above a room temperature, and in particular, within a range of about 300° C. to 700° C. so as to facilitate minimizing the interstitial defects within a crystal lattice structure of the implanted channel region. In another example, the ion implantation process may also be accomplished by selecting the process temperature to be below the room temperature, and in particular, within a range of about –20° C. to –100° C. Note that, in this example, the tensile stress-inducing dopant being implanted into the channel region may modulate the tensile stress by about 5 to 30%. In a specific example, the modulated tensile stress of the channel region may be within a range of about 1 to 5 GPa.

Figure 3D:
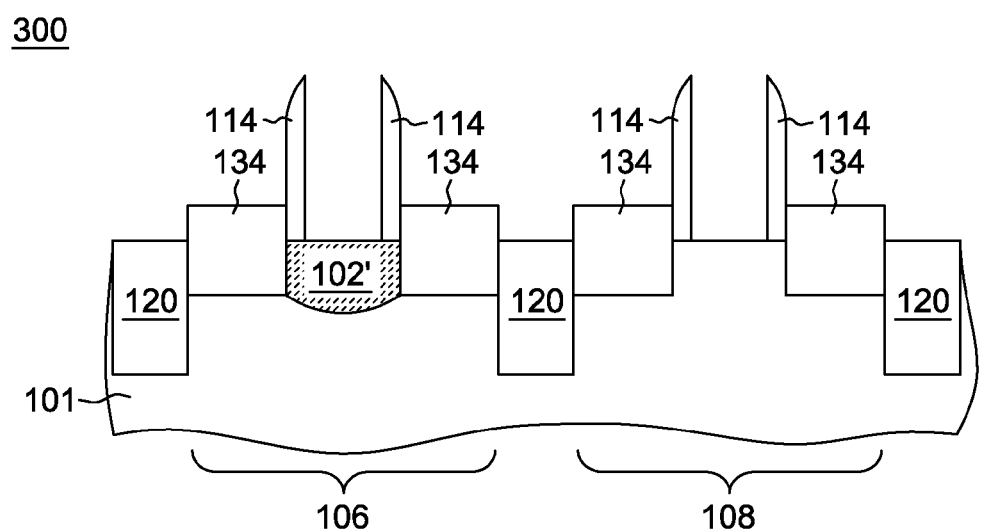
FIG. 3D depicts the structure of FIG. 3C, after removal of the protective layer, in accordance with one or more aspects of the present invention.

As illustrated in FIG. 3D, protective layer 336 (FIG. 3C) disposed over p-type transistor 108 may be removed, in accordance with one or more aspects of the present invention. The protective layer may be removed by any suitable etching process such as, for example, anisotropic dry etching processing, for instance, RIE.

Figure 3E:
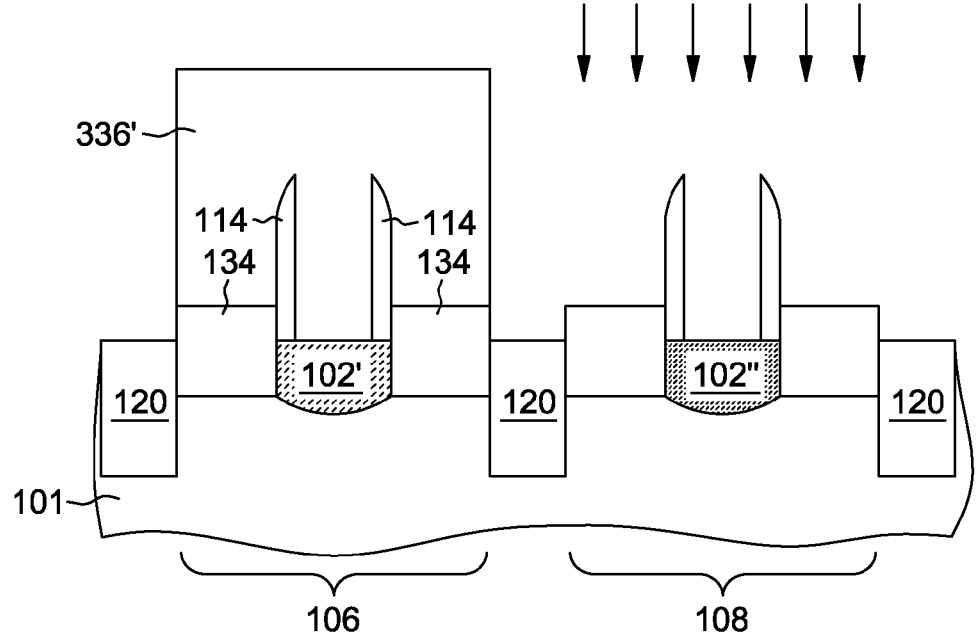
FIG. 3E depicts the structure of FIG. 3D, after providing a protective layer over the n-type transistor to, for instance, facilitate selectively implanting the channel region of the p-type transistor, in accordance with one or more aspects of the present invention.

FIG. 3E illustrates the structure of FIG. 3D after exposing channel region 102 of p-type transistor 108 while overlying n-type transistor 106 with a protective layer 336'. This protective layer 336' protects n-type transistor 106 from ion implantation processing to be subsequently performed within the p-type transistor. In one embodiment, protective layer 336' may include or be fabricated of a material such as, for instance, a nitride material, an oxide material or a silicon-containing material such as, for example, silicon carbide (SiC), oxy-silicon carbide (SiOC), amorphous carbon, amorphous silicon or silicon-rich anti-reflective coating (SiARC) layer or any combinations thereof. The deposition processes may include any conventional process such as, for example, low temperature CVD, PECVD, or ALD. In a further example, a low-pressure CVD or ALD-created mask may be used to form the protective layer. In other examples, other hard-mask materials, such as metal-oxides or metals, may be used.

Continuing with FIG. 3E, the exposed channel region of p-type transistor 108 may be implanted with one or more stress-inducing dopants, such as one or more compressive stress-inducing dopants, to modulate an intrinsic stress of the exposed channel region by forming an implanted channel region 102″. In one example, the compressive stress of the p-type transistor may be modulated by implanting the exposed channel region with one or more compressive stress-inducing dopants which may include or be fabricated of an electrically inactive dopant such as, for example, germanium. The term "compressive stress-inducing dopant" denotes a dopant having intrinsic compressive stress, in which the intrinsic compressive stress produces compressive stress in one or more adjacent materials. For instance, a compressive stress-inducing dopant may be a material having an intrinsic tensile stress, in which the intrinsic tensile stress produces a compressive stress in one or more adjacent materials, or a material with a smaller lattice constant and larger volume than the adjacent material that is lattice-matched to the stress-inducing dopant. In one example, the exposed channel region of p-type transistor 108 may be implanted with a stress-inducing dopant such as, for example, germanium or a compound of germanium (for instance, germane ($GeH_4$)) or germanium-tin alloy material, employing an implantation dose of about 5e15 to 1e16 $cm^{-2}$ and implantation energy of about 20 to 40 keV, at a temperature of about 300 to 700° C., to provide a concentration of germanium-containing stress-inducing dopant within implanted channel region 102″.

By way of example, the stress-inducing dopant may be implanted into the channel region via, for example, an ion implantation process employing controlled process parameters such as, for instance, implantation dose and/or implantation energy at a pre-selected temperature conditions so as to facilitate modulating the intrinsic stress of the channel region, while minimizing or preventing undesirable pre-amorphization damage within the implanted channel region 102″ of p-type transistor 108. In one example, the ion implantation process may be accomplished by selecting the process temperature to be above a room temperature, and in particular, within a range of about 300° C. to 700° C. so as to facilitate minimizing the interstitial defects within a crystal lattice structure of the channel region. In another example, the ion implantation process may also be accomplished by selecting the process temperature to be below the room temperature, and in particular, within a range of about −20° C. to −100° C. Note that, in one embodiment, the compressive stress-inducing dopant being implanted into the channel region may modulate the compressive stress by about 5 to 30%. In a specific example, the modulated compressive stress of the channel region may be within a range of about 1 to 5 GPa.

Figure 3F:
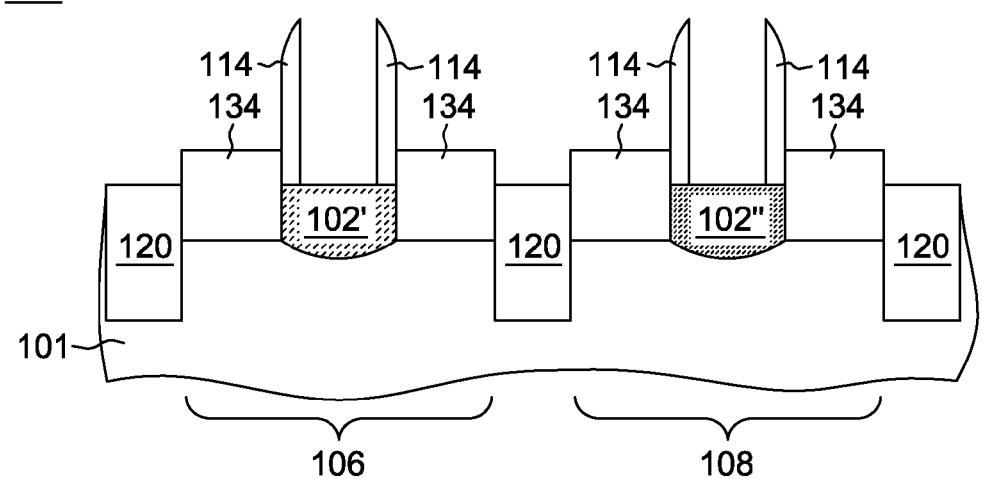
FIG. 3F depicts the structure of FIG. 3E, after removal of the protective layer, in accordance with one or more aspects of the present invention.

As illustrated in FIG. 3F, protective layer 336′ (FIG. 3E) disposed over n-type transistor 106 may be removed, in accordance with one or more aspects of the present invention. The protective layer may be removed by any suitable etching process such as, for example, anisotropic dry etching processing, for instance, RIE.

FIGS. 4A-4E depicts another example of an enhanced method for fabricating a fin-type field effect transistor. Advantageously, as described below, the fabricating method includes, for instance, implanting the at least one dopant, such as, for instance, a source and drain dopant along with a stress-inducing dopant, at a pre-selected temperature into the substrate to facilitate forming a non-epitaxially grown source and drain region, as well as modulating an intrinsic stress within the non-epitaxially grown source and drain region, in accordance with one or more aspects of the present invention.

Figure 4A:
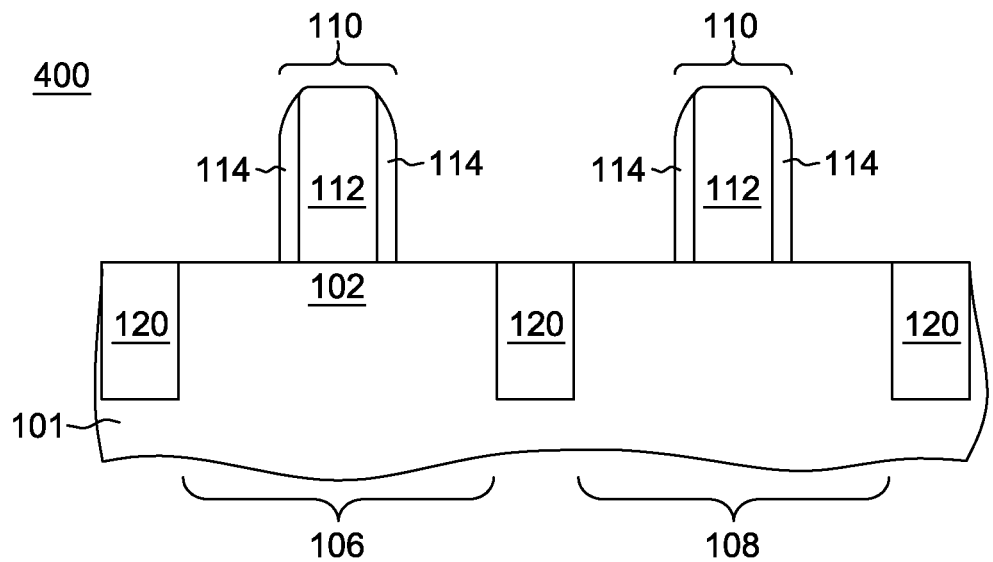
FIG. 4A is a cross-sectional elevational view of a structure obtained during another field-effect transistor fabrication process, in accordance with one or more aspects of the present invention.

Referring to FIG. 4A, structure 400 is illustrated similar or identical to structure 100 of FIG. 1A of the above-described processing flow. Briefly, structure 400 includes substrate 101, along with a plurality of transistors, for instance, N-type field-effect transistor (NFET) 106 (referred to herein as n-type transistor) and P-type field-effect transistor (PFET) 108 (referred to herein as p-type transistor) formed over the substrate. As noted, substrate 101 may be or include a semiconductor material, such as described in connection with FIG. 1A. The n-type transistor 106 and p-type transistor 108 may further include, for instance, gate structure(s) 110 overlying channel region 102 within substrate 101. In this example, gate structure(s) 110 includes sacrificial gate material 112 (such as polysilicon), and sidewall spacers 114, as described above. Isolation region 120, such as shallow trench isolation, at least partially surrounds the transistor, which as noted, may be a planar field-effect transistor or fin-type, field-effect transistor.

Figure 4B:
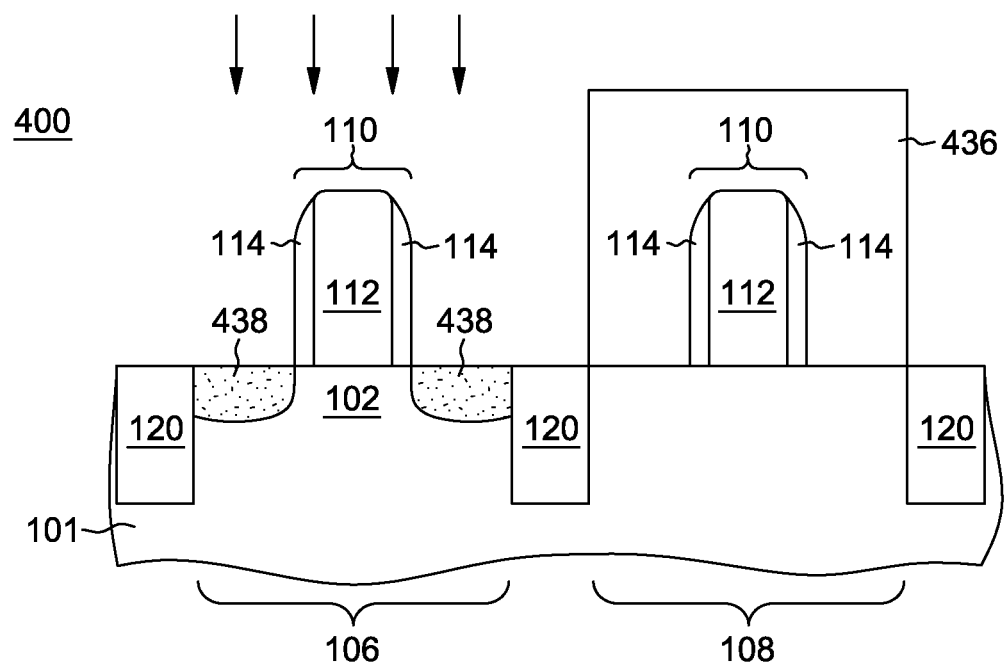
FIG. 4B depicts the structure of FIG. 4A, after exposing n-type transistor, while overlying p-type transistor with a protective layer and forming stressed source and drain region of the n-type transistor, in accordance with one or more aspects of the present invention.

FIG. 4B illustrates the structure of FIG. 4A after exposing a first region 106 of the substrate 101, while overlying a second region 108 with a protective layer 436. This protective layer 436 protects second region 108 from ion implantation processing to be subsequently performed within the first region. As discussed above, in one embodiment, protective layer 436 may include or be fabricated of a material such as, for instance, a nitride material, an oxide material or a silicon-containing material such as, for example, silicon nitride (SiN), silicon oxide ($SiO_2$), or an oxynitride (SiON), silicon carbide (SiC), oxy-silicon carbide (SiOC), amorphous carbon, amorphous silicon or silicon-rich anti-reflective coating (SiARC) layer or any combinations thereof. The deposition processes may include any conventional process such as, for example, low temperature CVD, PECVD, or ALD. In one specific example, silicon nitride may be deposited using process gases such as, for example, dichlorosilane ($SiH_2Cl_2$) and ammonia ($NH_3$) and using known process conditions. In a further example, a low-pressure CVD or ALD-created mask may be used to form the protective layer. In other examples, other hard-mask materials, such as metal-oxides or metals, may be used.

Continuing with FIG. 4B, first region 106 may be implanted with a source and drain dopant along with a stress-inducing dopant, in accordance with one or more aspects of the present invention. This implanting of the source and drain dopant along with the stress-inducing dopant advantageously facilitates forming non-epitaxially grown source and drain region 438 of n-type transistor, as well as modulating an intrinsic stress of the non-epitaxially grown source and drain region 438. By way of example, the source and drain dopant may be or include an n-type dopant. As used herein, an n-type dopant refers to the addition of impurities to the first region 106 (comprising, for instance, an intrinsic semiconductor material), which contributes more electrons to the intrinsic material, and may include (for instance) phosphorus, antimony or arsenic. In one example, the first region 106 may be implanted with, for instance, an n-type source and drain dopant such as, for instance, phosphorus or a compound of phosphorus (for instance, heptaphosphane ($P_7H_3$)), by employing an implantation dose of about 2e15 to 7e15 $cm^{-2}$, with an implantation energy of about 2 to 15 keV, to provide a desired concentration of n-type source and drain dopant within the first region 106 of substrate 101. In such an example, the concentration of n-type source and drain dopants implanted within substrate 101 may be in the range of about 5e20 to 3e21 $cm^{-3}$.

Additionally, as discussed above, one or more stress-inducing dopants such as, tensile stress-inducing dopants may also be implanted along with the source and drain dopants so as to facilitate modulating intrinsic stress of n-type transistor 106. In one example, the tensile stress of n-type transistor may be modulated by implanting the exposed channel region with one or more tensile stress-inducing dopants which may include or be fabricated of an electrically inactive dopant such as, for example, carbon. In one example, n-type transistor 106 may be implanted with a carbon-containing stress-inducing dopant such as, for example, cluster carbon, employing an implantation dose of about 3e15 to 5e15 $cm^{-2}$, with an implantation energy of about 4 to 10 keV and at a temperature of about 300 to 700° C., to provide a concentration of carbon-containing stress-inducing dopant within source and drain region 438.

By way of example, the source and drain dopant as well as the stress-inducing dopant may be implanted into the substrate via, for example, an ion implantation process employing controlled process parameters such as, for instance, implantation dose and/or implantation energy at a pre-selected temperature conditions so as to facilitate forming the non-epitaxially grown source and drain region 438 as well as modulating the intrinsic stress of the source and drain region, while minimizing or preventing undesirable pre-amorphization damage within substrate 101 of n-type transistor 106. In one example, the ion implantation process may be accomplished by selecting the process temperature to be above a room temperature, and in particular, within a range of about 300° C. to 700° C. so as to facilitate minimizing the interstitial defects within a crystal lattice structure of the substrate. In another example, the ion implantation process may also be accomplished by selecting the process temperature to be below the room temperature, and in particular, within a range of about –20° C. to –100° C. Note that, in this example, the tensile stress-inducing dopant being implanted into the substrate may modulate the tensile stress by about 5 to 30%. In a specific example, the modulated tensile stress of the source and drain region may be within a range of about 1 to 5 GPa.

Figure 4C:
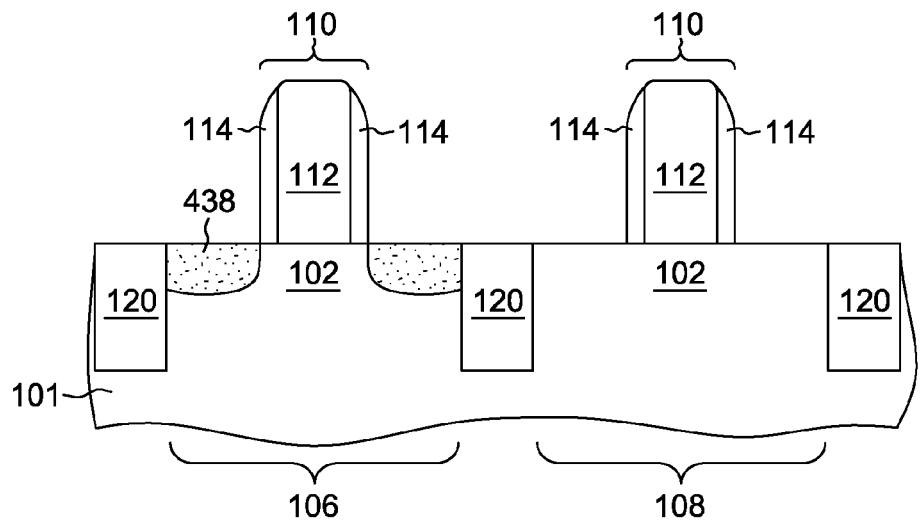
FIG. 4C depicts the structure of FIG. 4B, after removal of the protective layer, in accordance with one or more aspects of the present invention.

As illustrated in FIG. 4C, protective layer 436 (FIG. 4B) disposed over p-type transistor 108 may be removed, in accordance with one or more aspects of the present invention. The protective layer may be removed by any suitable etching process such as, for example, anisotropic dry etching processing, for instance, RIE.

Figure 4D:
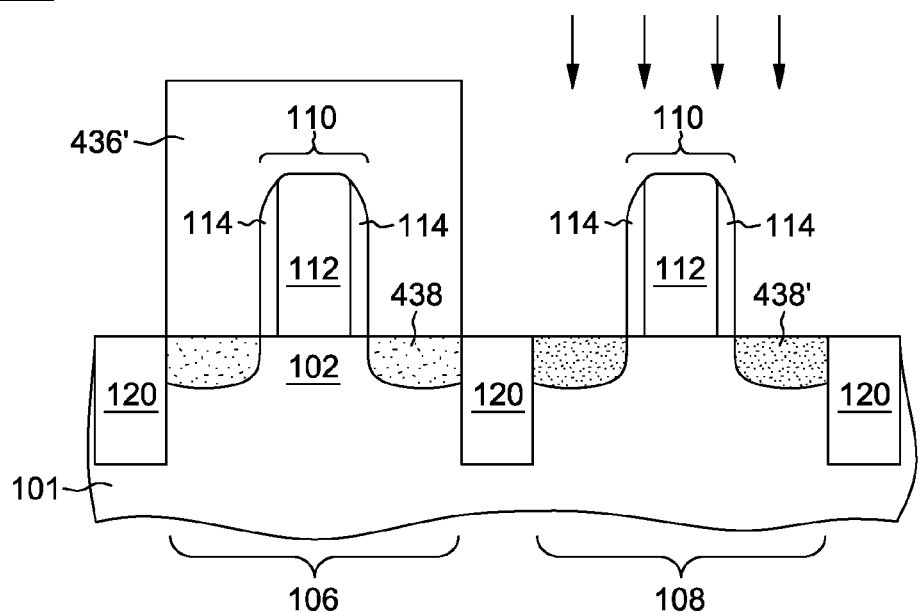
FIG. 4D depicts the structure of FIG. 4C, after exposing p-type transistor, while overlying n-type transistor with a protective layer and forming stressed source and drain region of the p-type transistor, in accordance with one or more aspects of the present invention.

FIG. 4D illustrates the structure of FIG. 4C after exposing a second region of substrate 101, while overlying n-type transistor 106 with a protective layer 436'. This protective layer 436' protects n-type transistor 106 from ion implantation processing to be subsequently performed within the second region. In one embodiment, protective layer 436' may include or be fabricated of a material such as, for instance, a nitride material, an oxide material or a silicon-containing material such as, for example, silicon nitride (SiN), silicon oxide ($SiO_2$), or an oxynitride (SiON), silicon carbide (SiC), oxy-silicon carbide (SiOC), amorphous carbon, amorphous silicon or silicon-rich anti-reflective coating (SiARC) layer or any combinations thereof. The deposition processes may include any conventional process such as, for example, low temperature CVD, PECVD, or ALD. In one specific example, silicon nitride may be deposited using process gases such as, for example, dichlorosilane ($SiH_2Cl_2$) and ammonia ($NH_3$) and using known process conditions. In a further example, a low-pressure CVD or ALD-created mask may be used to form the protective layer. In other examples, other hard-mask materials, such as metal-oxides or metals, may be used.

Continuing with FIG. 4D, second region 108 may be implanted with source and drain dopants along with one or more stress-inducing dopants, in accordance with one or more aspects of the present invention. This implanting of the source and drain dopant along with the stress-inducing dopant advantageously facilitates forming non-epitaxially grown source and drain region 438' of p-type transistor, as well as modulating an intrinsic stress of the non-epitaxially grown source and drain region 438'. By way of example, the source and drain dopant may be or include a p-type dopant. Note that as used herein, p-type dopant refers to the addition of an impurity to the second region 108 (comprising, for instance, an intrinsic semiconductor material) to create deficiencies of valence electrons. Examples of a p-type dopant may include boron, aluminum, gallium or indium, any one or more of which may be added to second region 108. In one example, the second region 108 may be implanted with, for instance, a p-type active dopant such as, for instance, boron or a compound of boron (for instance, boron trifluoride ($BF_3$), octadecaborane ($B_{18}H_{22}$)), by employing an implantation dose of about 2e15 to 7e15 $cm^{-2}$, with an implantation energy of about 1 to 10 keV, to provide a desired concentration of p-type active dopant within the second region 108 of the substrate 101. In such an example, the concentration of p-type active dopants implanted within substrate 101 may be in the range of about 2e20 to 2e21 $cm^{-3}$.

Additionally, as discussed above, one or more stress-inducing dopants such as, for example, one or more compressive stress-inducing dopants may also be implanted with the source and drain dopants so as to modulate an intrinsic stress of the p-type transistor, in accordance with one or more aspects of the present invention. In one example, the compressive stress of the p-type transistor may be modulated by implanting the soubstrate with one or more compressive stress-inducing dopants which may include or be fabricated of an electrically inactive dopant such as, for example, germanium. The term "compressive stress-inducing dopant" denotes a dopant having intrinsic compressive stress, in which the intrinsic compressive stress produces compressive stress in one or more adjacent materials. For instance, a compressive stress-inducing dopant may be a material having an intrinsic tensile stress, in which the intrinsic tensile stress produces a compressive stress in one or more adjacent materials, or a material with a smaller lattice constant and larger volume than the adjacent material that is lattice-matched to the stress-inducing dopant. In one example, substrate 101 of p-type transistor 108 may be implanted with a stress-inducing dopant such as, for example, germanium or a compound of germanium (for instance, germane ($GeH_4$)), employing an implantation dose of about 5e15 to 1e16 $cm^{-2}$, with an implantation energy of about 20 to 40 keV and at a temperature of about 300 to 700° C., to provide a concentration of germanium-containing stress-inducing dopant within substrate 101.

By way of example, the source and drain dopant as well as the stress-inducing dopant may be implanted into the substrate via, for example, an ion implantation process employing controlled process parameters such as, for instance, implantation dose and/or implantation energy at a pre-selected temperature conditions so as to facilitate forming the non-epitaxially grown source and drain region 438' as well as modulating the intrinsic stress of the source and drain region, while minimizing or preventing undesirable pre-amorphization damage within substrate 101 of p-type transistor 108. In one example, the ion implantation process may be accomplished by selecting the process temperature to be above a room temperature, and in particular, within a range of about 300° C. to 700° C. so as to facilitate minimizing the interstitial defects within a crystal lattice structure of the substrate. In another example, the ion implantation process may also be accomplished by selecting the process temperature to be below the room temperature, and in particular, within a range of about −20° C. to −100° C. Note that, in one embodiment, the compressive stress-inducing dopant being implanted into the substrate may modulate the compressive stress by about 5 to 30%. In a specific example, the modulated compressive stress of the source and drain region may be within a range of about 1 to 5 GPa.

Figure 4E:
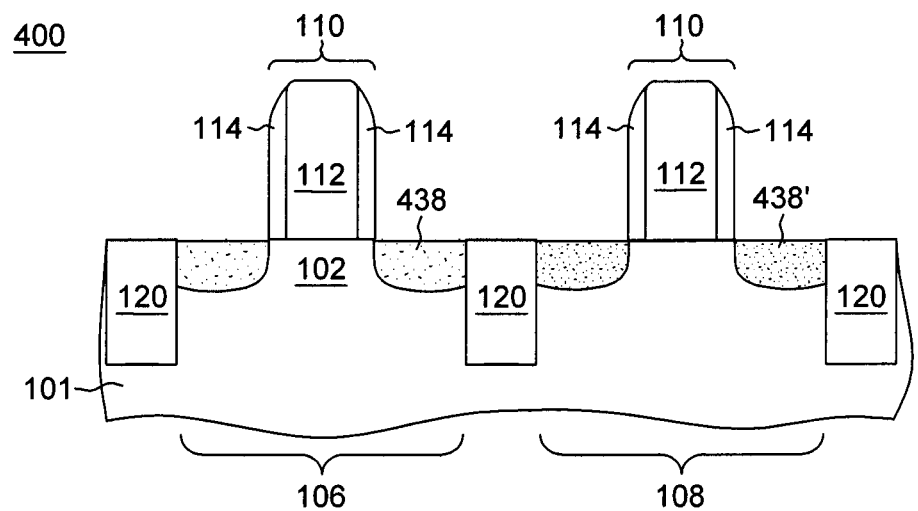
FIG. 4E depicts the structure of FIG. 4D, after removal of the protective layer, in accordance with one or more aspects of the present invention.

As illustrated in FIG. 4E, protective layer 436' (FIG. 3E) disposed over p-type transistor 108 may be removed, in accordance with one or more aspects of the present invention. The protective layer may be removed by any suitable etching process such as, for example, anisotropic dry etching processing, for instance, RIE.

Figure 5:
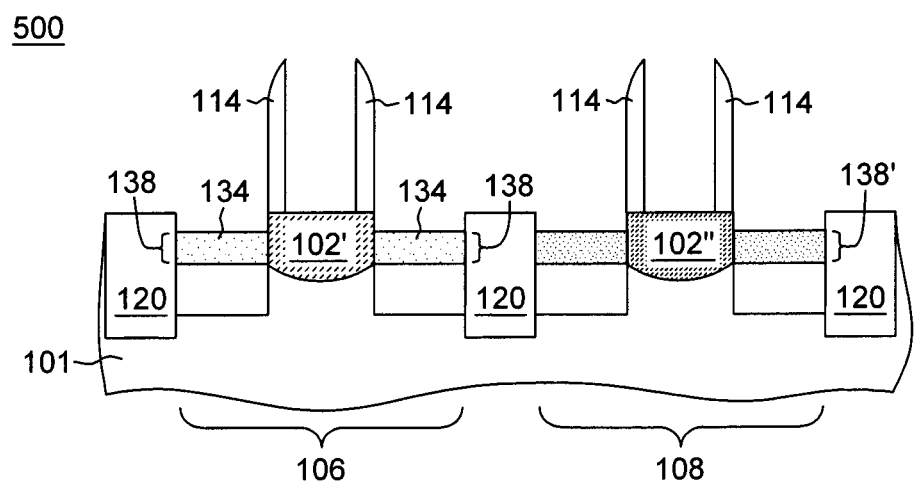
FIG. 5 depicts one example of the features of the semiconductor structures of both FIGS. 1G and 3F, combined together into a semiconductor structure. That is, a combination of epitaxial source and drain regions with implanted dopants therein, as shown in FIG. 1G, and the channels of FIG. 3F with implanted dopants therein.

FIG. 5 depicts one example of the features of the semiconductor structures of both FIGS. 1G and 3F, combined together into semiconductor structure 500. That is, a combination of epitaxial source and drain regions with implanted dopants therein (138/134), as shown in FIG. 1G, and the channels of FIG. 3F with implanted dopants therein (102' and 102'').

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising: fabricating a field-effect transistor, the fabricating comprising: providing a gate structure disposed over a substrate; and forming a source and drain region within the substrate separated by a channel region, the channel region underlying, at least partially, the gate structure, and the forming comprising implanting at least one dopant at a pre-selected temperature into the source and drain region to facilitate increasing a concentration of the at least one dopant within the source and drain region, wherein the implanting of the at least one dopant at the pre-selected temperature facilitates reducing contact resistance of the source and drain region and increasing charge carrier mobility through the channel region; exposing the channel region below the gate structure and implanting the at least one dopant at the pre-selected temperature into the exposed channel region to facilitate modulating an intrinsic stress disposed within the exposed channel region; wherein the at least one dopant comprises a first dopant of a first conductivity type, and the forming further comprises forming an epitaxially grown source and drain region having the first dopant of a first conductivity type disposed therein, and the fabricating further comprises, subsequent to the forming, implanting a second dopant of a second conductivity type at the pre-selected temperature into an upper surface of the epitaxially grown source and drain region.

2. The method of claim 1, wherein the implanting of the second dopant of the second conductivity type facilitates forming a strained epitaxially grown source and drain region.

3. The method of claim 1, wherein the implanting of the second dopant of the second conductivity type is performed at the pre-selected temperature being within a range of about 300° C. to 700° C. or about −20° C. to −100° C.

4. The method of claim 1, wherein the first dopant of the first conductivity type comprises a first dopant material, and the second dopant of the second conductivity type comprises a second dopant material, the first dopant material and the second dopant material being the same dopant materials.

5. The method of claim 1, wherein the implanting of the second dopant of the second conductivity type at the pre-selected temperature facilitates reducing junction leakage current as well as minimizing interstitial defects within a crystal lattice structure of a material of the field-effect transistor.

6. The method of claim 1, wherein the implanting facilitates creating an intrinsic stress within the source and drain region as well as increasing carrier mobility through the channel region.

7. The method of claim 1, further comprising implanting, subsequent to the forming of the source and drain region, the at least one dopant at the pre-selected temperature into a gate material of the gate structure, the implanting of the at least one dopant into the gate material facilitates modulating an intrinsic stress of the gate structure.

8. The method of claim 7, wherein the implanting further comprises performing an annealing process, subsequent to the implanting of the at least one dopant, the annealing process facilitating memorizing stress within the channel region or the source and drain region separated by the channel region.

9. The method of claim 7, wherein the at least one dopant comprises a stress-inducing dopant, the stress-inducing dopant being at least one of germanium, carbon, arsenic or silicon.

10. The method of claim 9, wherein the implanting of the stress-inducing dopant into the gate material of the gate structure is performed at the pre-selected temperature within a range of about 300° C. to about 700° C.

11. The method of claim 9, wherein the implanting of the stress-inducing dopant into the gate material of the gate structure is performed at the pre-selected temperature within a range of about −20° C. to about −100° C.

12. The method of claim 1, wherein the at least one dopant comprises a stress-inducing dopant, the stress-inducing dopant being at least one of germanium, carbon, arsenic or silicon.

13. The method of claim 1, wherein the implanting of the stress-inducing dopant into the exposed channel region is performed at the pre-selected temperature within a range of about 300° C. to about 700° C., or with a range of about −20° C. to about −100° C.

* * * * *